United States Patent
Forbes et al.

(10) Patent No.: US 7,351,628 B2
(45) Date of Patent: *Apr. 1, 2008

(54) ATOMIC LAYER DEPOSITION OF CMOS GATES WITH VARIABLE WORK FUNCTIONS

(75) Inventors: Leonard Forbes, Corvallis, OR (US); Kie Y. Ahn, Chappaqua, NY (US)

(73) Assignee: Micron Technology, Inc., Boise, ID (US)

( * ) Notice: Subject to any disclaimer, the term of this patent is extended or adjusted under 35 U.S.C. 154(b) by 112 days.

This patent is subject to a terminal disclaimer.

(21) Appl. No.: 10/929,822

(22) Filed: Aug. 30, 2004

(65) Prior Publication Data

US 2005/0032342 A1 Feb. 10, 2005

Related U.S. Application Data

(62) Division of application No. 10/225,605, filed on Aug. 22, 2002.

(51) Int. Cl.
*H01L 21/00* (2006.01)

(52) U.S. Cl. ............... 438/199; 438/275; 438/592; 257/E21.63

(58) Field of Classification Search .......... 438/592, 438/595, 199, 275; 257/E21.63
See application file for complete search history.

(56) References Cited

U.S. PATENT DOCUMENTS

| | | | |
|---|---|---|---|
| 3,865,654 A * | 2/1975 | Chang et al. ............ | 438/216 |
| 4,435,896 A * | 3/1984 | Parrillo et al. .......... | 438/217 |
| 5,042,011 A | 8/1991 | Casper et al. ........... | 365/205 |
| 5,153,144 A * | 10/1992 | Komori et al. .......... | 438/264 |
| 5,192,589 A | 3/1993 | Sandhu | |
| 5,246,881 A | 9/1993 | Sandhu et al. | |
| 5,280,205 A | 1/1994 | Green et al. ............ | 307/530 |
| 5,399,379 A | 3/1995 | Sandhu | |
| 5,589,413 A | 12/1996 | Sung et al. ............. | 437/43 |
| 5,627,785 A | 5/1997 | Gilliam et al. ......... | 365/189.01 |
| 5,659,057 A | 8/1997 | Vaartstra | |
| 5,828,113 A | 10/1998 | Chen et al. | |
| 5,866,205 A | 2/1999 | Vaartstra et al. | |
| 6,081,034 A | 6/2000 | Sandhu et al. | |
| 6,107,656 A | 8/2000 | Igarashi | |
| 6,110,529 A | 8/2000 | Gardiner et al. | |

(Continued)

FOREIGN PATENT DOCUMENTS

| | | |
|---|---|---|
| GB | 2353404 | 2/2001 |
| JP | 62-199019 | 9/1987 |

OTHER PUBLICATIONS

Alen, Petra, "Atomic Layer deposition of Ta(Al)N(C) thin films using trimethylaluminum as a reducing agent", *Journal of the Electrochemical Society*, 148(10), (Oct. 2001), G566-G571.

(Continued)

*Primary Examiner*—Richard A. Booth
(74) *Attorney, Agent, or Firm*—Schwegman, Lundberg & Woessner, P.A.

(57) ABSTRACT

Structures, systems and methods for transistors having gates with variable work functions formed by atomic layer deposition are provided. One transistor embodiment includes a first source/drain region, a second source/drain region, and a channel region therebetween. A gate is separated from the channel region by a gate insulator. The gate includes a ternary metallic conductor formed by atomic layer deposition.

14 Claims, 5 Drawing Sheets

U.S. PATENT DOCUMENTS

| | | | |
|---|---|---|---|
| 6,161,500 A | 12/2000 | Kopacz et al. | |
| 6,171,900 B1 | 1/2001 | Sun | |
| 6,174,377 B1 | 1/2001 | Doering et al. | |
| 6,175,129 B1 | 1/2001 | Liu et al. | |
| 6,197,628 B1 | 3/2001 | Vaartstra et al. | |
| 6,200,893 B1 | 3/2001 | Sneh | |
| 6,203,613 B1 | 3/2001 | Gates et al. | |
| 6,214,662 B1 | 4/2001 | Sung et al. | 438/241 |
| 6,218,293 B1 | 4/2001 | Kraus et al. | |
| 6,225,168 B1 | 5/2001 | Gardner et al. | |
| 6,271,131 B1 | 8/2001 | Uhlenbrock et al. | |
| 6,277,693 B1 | 8/2001 | Chen | 438/264 |
| 6,284,646 B1 | 9/2001 | Leem | |
| 6,291,340 B1 | 9/2001 | Sandhu et al. | |
| 6,297,539 B1 | 10/2001 | Ma et al. | |
| 6,302,964 B1 | 10/2001 | Umotoy et al. | |
| 6,303,481 B2 | 10/2001 | Park | |
| 6,323,081 B1 | 11/2001 | Marsh | |
| 6,325,017 B1 | 12/2001 | DeBoer et al. | |
| 6,338,880 B1 | 1/2002 | Akram | |
| 6,348,386 B1 | 2/2002 | Gilmer | |
| 6,360,685 B1 | 3/2002 | Xia et al. | |
| 6,365,519 B2 | 4/2002 | Kraus et al. | |
| 6,368,941 B1 | 4/2002 | Chen et al. | |
| 6,380,579 B1 | 4/2002 | Nam et al. | |
| 6,383,955 B1 | 5/2002 | Matsuki | |
| 6,391,769 B1 | 5/2002 | Lee et al. | |
| 6,399,491 B2* | 6/2002 | Jeon et al. | 438/680 |
| 6,410,432 B1 | 6/2002 | Hautala et al. | |
| 6,420,279 B1 | 7/2002 | Ono et al. | |
| 6,423,619 B1 | 7/2002 | Grant et al. | 438/589 |
| 6,432,779 B1 | 8/2002 | Hobbs et al. | |
| 6,444,039 B1 | 9/2002 | Nguyen | |
| 6,444,895 B1 | 9/2002 | Nikawa | |
| 6,445,023 B1 | 9/2002 | Vaartstra et al. | |
| 6,448,192 B1 | 9/2002 | Kaushik | |
| 6,458,701 B1 | 10/2002 | Chae et al. | |
| 6,465,334 B1 | 10/2002 | Buynoski et al. | |
| 6,468,924 B2 | 10/2002 | Lee et al. | |
| 6,475,276 B1 | 11/2002 | Elers et al. | |
| 6,482,740 B2 | 11/2002 | Soininen et al. | |
| 6,486,047 B2 | 11/2002 | Lee et al. | |
| 6,492,694 B2 | 12/2002 | Noble et al. | |
| 6,495,436 B2 | 12/2002 | Ahn et al. | |
| 6,514,828 B2 | 2/2003 | Ahn et al. | |
| 6,524,952 B1 | 2/2003 | Srinivas et al. | |
| 6,531,192 B2 | 3/2003 | Akram | |
| 6,534,395 B2 | 3/2003 | Werkhoven et al. | |
| 6,534,420 B2 | 3/2003 | Ahn et al. | |
| 6,537,901 B2* | 3/2003 | Cha et al. | 438/592 |
| 6,548,405 B2 | 4/2003 | Kraus et al. | |
| 6,576,053 B1 | 6/2003 | Kim et al. | |
| 6,605,549 B2 | 8/2003 | Leu et al. | |
| 6,614,079 B2 | 9/2003 | Lee | 257/382 |
| 6,617,634 B2 | 9/2003 | Marsh et al. | |
| 6,624,517 B1 | 9/2003 | Sandhu et al. | |
| 6,630,201 B2 | 10/2003 | Chiang et al. | |
| 6,630,391 B2 | 10/2003 | Agarwal et al. | |
| 6,630,718 B1 | 10/2003 | Tivedi | |
| 6,632,736 B2 | 10/2003 | Sandhu et al. | |
| 6,656,282 B2 | 12/2003 | Kim et al. | |
| 6,674,109 B1* | 1/2004 | Fujimori et al. | 257/295 |
| 6,723,642 B1 | 4/2004 | Lim et al. | |
| 6,727,169 B1 | 4/2004 | Raaijmakers et al. | |
| 6,737,317 B2 | 5/2004 | Marsh et al. | |
| 6,770,521 B2 | 8/2004 | Visokay et al. | |
| 6,800,173 B2 | 10/2004 | Chiang et al. | |
| 6,812,139 B2 | 11/2004 | Givens et al. | |
| 6,830,983 B2 | 12/2004 | Marsh | |
| 6,873,020 B2 | 3/2005 | Misra et al. | |
| 6,881,667 B2 | 4/2005 | Sandhu et al. | |
| 6,911,381 B2 | 6/2005 | Agarwal et al. | |
| 6,919,273 B1 | 7/2005 | Otsuki et al. | |
| 6,921,702 B2 | 7/2005 | Ahn et al. | |
| 6,953,730 B2 | 10/2005 | Ahn et al. | |
| 6,953,743 B2 | 10/2005 | Sandhu et al. | |
| 6,958,302 B2 | 10/2005 | Ahn et al. | |
| 6,967,154 B2 | 11/2005 | Meng et al. | |
| 7,018,933 B2* | 3/2006 | Kim et al. | 438/710 |
| 2001/0014521 A1 | 8/2001 | Kraus et al. | |
| 2002/0001906 A1 | 1/2002 | Park | 438/287 |
| 2002/0106896 A1 | 8/2002 | Kraus et al. | |
| 2002/0195683 A1 | 12/2002 | Kim et al. | |
| 2003/0162342 A1 | 8/2003 | Chen et al. | |
| 2004/0164362 A1 | 8/2004 | Conley, Jr. | |
| 2005/0042373 A1 | 2/2005 | Kraus et al. | |
| 2005/0179097 A1 | 8/2005 | Forbes et al. | |
| 2006/0134870 A1 | 6/2006 | Luan et al. | |
| 2006/0237796 A1 | 10/2006 | Cartier et al. | |
| 2007/0141797 A1 | 6/2007 | Li | |
| 2007/0164323 A1 | 7/2007 | Forbes et al. | |

OTHER PUBLICATIONS

Claflin, B., et al., "Investigation of the growth and chemical stability of composite metal gates on ultra-thin gate dielectrics", *Silicon Front-End Technology—Materials Processing and Modelling. Symposium. Mater. Res. Soc.*, (1998), 171-6.

Klaus, J W., et al., "Atomic Layer Deposition of Tungsten Nitride Films Using Sequential Surface Reactions", *Journal of the Electrochemical Society, vol. 147, No. 3*, (Mar. 2000), 1175-1181.

Koo, J., "Study on the characteristics of TiAlN thin film deposited by atomic layer deposition method", *Journal of Vacuum Science & Technology A-Vacuum Surfaces & Films, 19(6)*, (Nov. 2001), 2831-4.

Lu, Qiang, et al., "Dual-metal gate technology for deep-submicron CMOS transistors", *2000 Symposium on VLSI Technology. Digest Technical Papers. IEEE. 2000*, Cat. No.00CH37104, Piscataway, NJ, USA, (2000), 72-3.

Min, Jae-Sik, et al., "Atomic layer deposition of TiN films by alternate supply of tetrakis (ethylmethylamino)-titanium and ammonia", *Japanese Journal of Applied Physics Part 1-Regular Papers Short Notes & Review Papers, 37(9A)*, (Sep. 1998), 4999-5004.

Min, Jae-Sik, et al., "Metal-Organic Atomic-layer Deposition of Titanium-Silicon-Nitride Films" *Applied Physics Letters, 75(11)*, (Sep. 13, 1999), 1521-1523.

Misra, V., et al., "Electrical properties of Ru-based alloy gate electrodes for dual metal gate Si-CMOS", *IEEE Electron Device Letters, vol. 23, No. 6*, (Jun. 2002), 354-6.

Morishita, S., "Atomic-layer chemical-vapor-deposition of SiO/sub 2/ by cyclic exposures of CH/sub 3/OSi(NCO)/sub 3/ and H/sub 2/O/sub 2/", *Japanese Journal of Applied Physics Part 1-Regular Papers Short Notes & Review Papers, 34(10)*, (Oct. 1995), 5738-42.

Morishita, S., et al., "Atomic-layer chemical-vapor-deposition of SiO/sub 2/ by cyclic exposures of CH/sub 3/OSi(NCO)/sub 3/ and H/sub 2/O/sub 2/", *Japanese Journal of Applied Physics Part 1-Regular Papers Short Notes & Review Papers, 34(10)*, (Oct. 1995), 5738-42.

Moriwaki, M., "Improved metal gate process by simultaneous gate-oxide nitridation during W/WN/sub x/gate formation", *Japanese Journal of Applied Physics Part 1-Regular Papers Short Notes & Review Papers, 39(4B)*, (Apr. 2000), 2177-2180.

Park, Jin-Seong, et al., "Plasma-enhanced atomic layer deposition of tantalum nitrides using hydrogen radicals as a reducing agent", *Electrochemical & Solid-State Letters, vol. 4, No. 4*, (Apr. 2001), C17-19.

Park, Dae-Gyu, et al., "Robust ternary metal gate electrodes for dual gate CMOS devices", *International Electron Devices Meeting. Technical Digest*, (2001), 30.6.1-4.

Park, D.G., et al., "Robust Ternary Metal Gate Electrodes for Dual Gate CMOS Devices", *Electron Devices Meeting 2001 IEDM Technical Digest*, (Dec. 2-5, 2001), 30.6.1-30.6.4.

Puurunen, R L., "Growth of aluminium nitride on porous silica by atomic layer chemical vapour deposition", *Applied Surface Science*, vol. 165, No. 2-3, (Sep. 2000), 193-202.

Schwantes, S., et al., "Performance Improvement of Metal Gate CMOS Technologies with Gibabit Feature Sizes", *Proc. European Workshop on the Ultimate Integration of Silicon*, (Mar. 2002),99-103.

Shimada, H., et al., "Low resistivity bcc-Ta/TaN/sub x/ metal gate MNSFETs having plane gate structure featuring fully low-temperature processing below 450 degrees C", *2001 Symposium on VLSI Technology. Digest of Technical Papers, Japan Soc. Appl. Phys.*, (2001),67-68.

Shimada, H., et al., "Tantalum nitride metal gate FD-SOI CMOS FETs using low resistivity self-grown bcc-tantalum layer", *IEEE Transactions on Electron Devices*, vol. 48, No. 8, (Aug. 2001),1619-26.

Sneh, Ofer, "Thin film atomic layer deposition equipment for semiconductor processing", *Thin Solid Films*, 402(1-2), (Jan. 2002),248-261.

Wakabayashi, H., et al., "A dual-metal gate CMOS technology using nitrogen-concentration-controlled TiNx film", *IEEE Transactions on Electron Devices*, vol. 48, No. 10, (Oct. 2001),2363-9.

Yagishita, A., "Dynamic threshold voltage damascene metal gate MOSFET (DT-DMG-MOS) with low threshold voltage, high drive current and uniform electrical characteristics", *International Electron Devices Meeting 2000. Technical Digest. IEDM*, (Dec. 2000),663-666.

Yeo, Yee-Chia, et al., "Dual-metal gate CMOS technology with ultrathin silicon nitride gate dielectric", *IEEE Electron Device Letters*, vol. 22, No. 5, (May 2001),227-9.

Zhong, Huicai, et al., "Electrical properties of RuO/sub 2/ gate electrodes for dual metal gate Si-CMOS", *IEEE Electron Device Letters*, vol. 21, No. 12, (Dec. 2000),593-5.

Zhong, Huicai, et al., "Properties of Ru-Ta alloys as gate electrodes for NMOS and PMOS silicon devices", *International Electron Devices Meeting. Technical Digest IEEE.*, Cat. No. 01CH37224,(2001),20.5.1-4.

Zhong, Huicai, et al., "Properties of Ru-Ta alloys as gate electrodes for NMOS and PMOS silicon devices", *International Electron Devices Meeting. Technical Digest*, (2001),20.5.1-4.

Forbes, Leonard, et al., "Metal-Substituted Transistor Gates", *U.S. Appl. No. 11/176,738; filed Jul. 7, 2005*.

Forsgren, Katarina, "CVD and ALD of Group IV-and V-Oxides for Dielectric Applications", *Comprehensive Summaries of Uppsala Dissertation from the Faculty of Science and Technology*, 665, (2001).

Geusic, J., et al., "Structured Silicon Surfaces and Tunnel Oxides for Flash Memory Devices", *Micron Disclosure*, (Sep. 25, 1997).

Hao, M. Y., "Electrical Characteristics of Oxynitrides Grown on Textured Single-Crystal Silicon", *Appl. Phys. Lett.*, 60, (Jan. 1992),455-447.

Kim, Byoung-Youp, et al., "Comparison study for TiN films deposited from different method: chemical vapor deposition and atomic layer deposition", *Mechanisms of Surface and Microstructure Evolution in Deposited Films and Film Structures Symposium (Materials Research Society Symposium Proceedings vol. 672)*, (2001),7.8.1-7.8.6.

Leskela, M., "ALD precursor chemistry: Evolution and future challenges", *J. Phys. IV France*, 9, (1999),837-852.

Lucovsky, G, et al., "Microscopic model for enhanced dielectric constants in low concentration $SiO_2$-rich noncrystalline Zr and Hf silicate alloys", *Applied Physics Letters*, 77(18), (Oct. 2000),2912-2914.

Nakajima, Anri, et al., "$NH_3$-annealed atomic-layer-deposited silicon nitride as a high-k gate dielectric with high reliability", *Applied Physics Letters*, 80(7), (Feb. 2002), 1252-1254.

Rossnagel, S. M., et al., "Plasma-enhanced atomic layer deposition of Ta and Ti for Interconnect diffusion barriers", *Journal of Vacuum Science & Technology B (Microelectronics and Nanometer Structures)*, 18(4), (Jul. 2000),2016-2020.

Sneh, Ofer, "Thin film atomic layer deposition equipment for semiconductor processing", *Thin Solid Films*, 402, (2002),248-261.

Suntola, T., "Atomic Layer Epitaxy", *Handbook of Crystal Growth, 3; Thin Films of Epitaxy, Part B: Growth Mechanics and Dynamics*, Amsterdam, (1994),601-663.

Suntola, Tuomo, "Atomic layer epitaxy", *Thin Solid Films*, 216(1), (Aug. 28, 1992),84-89.

U.S. Appl. No. 10/225,605 Final office action mailed Feb. 9, 2005, 18 pgs.

U.S. Appl. No. 10/225,605 Final office action mailed Feb. 27, 2007, 25 pgs.

U.S. Appl. No. 10/225,605 Final office action mailed Mar. 14, 2006, 22 pgs.

U.S. Appl. No. 10/225,605 Non Final office action mailed Apr. 7, 2004, 19 pgs.

U.S. Appl. No. 10/225,605 Non Final office action mailed Aug. 8, 2005, 19 pgs.

U.S. Appl. No. 10/225,605 Non Final office action mailed Sep. 26, 2006, 19 pgs.

U.S. Appl. No. 10/225,605 Non Final office action mailed Oct. 6, 2003, 18 pgs.

U.S. Appl. No. 10/225,605 Non Final office action mailed Oct. 14, 2004, 24 pgs.

U.S. Appl. No. 10/225,605 Response filed Jan. 6, 2004 to Non Final office action mailed Oct. 6, 2003, 16 pgs.

U.S. Appl. No. 10/225,605 Response filed Apr. 13, 2005 to Final office action mailed Feb. 9, 2005, 17 pgs.

U.S. Appl. No. 10/225,605 Response filed Apr. 15, 2006 to Final office action mailed Mar. 14, 2006, 20 pgs.

U.S. Appl. No. 10/225,605 Response filed Apr. 24, 2007 to Final office action mailed Feb. 27, 2007, 22 pgs.

U.S. Appl. No. 10/225,605 Response filed May 9, 2005 to Advisory Action mailed Apr. 27, 2005, 17 pgs.

U.S. Appl. No. 10/225,605 Response filed May 24, 2007 to Advisory Action mailed May 8, 2007, 22 pgs.

U.S. Appl. No. 10/225,605 Response filed Jul. 7, 2004 to Non Final office action mailed Apr. 7, 2004, 15 pgs.

U.S. Appl. No. 10/225,605 Response filed Jul. 14, 2006 to Advisory Action mailed May 30, 2006, 16 pgs.

U.S. Appl. No. 10/225,605 Response filed Nov. 30, 2004 to Non Final office action mailed Oct. 14, 2004, 16 pgs.

U.S. Appl. No. 10/225,605 Response filed Dec. 22, 2006 to office action mailed Sep. 26, 2006, 22 pgs.

U.S. Appl. No. 10/754,842, Response filed Sep. 6, 2007 to Non-Final Office Action mailed Jun. 6, 2007, 18 pgs.

U.S. Appl. No. 10/754,842 Final Office Action mailed Jan. 25, 2006, 13 pgs.

U.S. Appl. No. 10/754,842 Final Office Action mailed Dec. 19, 2006, 10 pgs.

U.S. Appl. No. 10/754,842 Non Final Office Action mailed Jun. 6, 2007, 11 pgs.

U.S. Appl. No. 10/754,842 Non Final Office Action mailed Jul. 21, 2006, 12 pgs.

U.S. Appl. No. 10/754,842 Non Final Office Action mailed Aug. 9, 2005, 16 pgs.

U.S. Appl. No. 10/754,842 Response filed Jan. 29, 2007 to Final Office Action mailed Dec. 19, 2006, 16 pgs.

U.S. Appl. No. 10/754,842 Response filed Mar. 19, 2007 to Advisory Action mailed Feb. 9, 2007, 16 pgs.

U.S. Appl. No. 10/754,842 Response filed Apr. 12, 2006 to Final Office Action mailed Jan. 25, 2006, 13 pgs.

U.S. Appl. No. 10/754,842 Response filed Oct. 20, 2006 to Non Final Office Action mailed Jul. 21, 2006, 16 pgs.

U.S. Appl. No. 10/754,842 Response filed Nov. 8, 2005 to Non Final Office Action mailed Aug. 9, 2005, 17 pgs.

U.S. Appl. No. 11/038,730, Response filed Sep. 14, 2007 to Non-Final Office Action mailed Jun. 14, 2007, 16 pgs.

U.S. Appl. No. 11/333,910 Non-Final Office Action mailed Aug. 8, 2007,14 pgs.

\* cited by examiner

ATOMIC LAYER DEPOSITION OF CMOS GATES WITH VARIABLE WORK FUNCTIONS

CROSS REFERENCE TO RELATED APPLICATION

This application is a Divisional of U.S. Ser. No. 10/225,605 filed on Aug. 22, 2002, which application is incorporated herein by reference.

FIELD OF THE INVENTION

The present invention relates generally to semiconductor integrated circuits and, more particularly, to atomic layer deposition of CMOS gates with variable work functions.

BACKGROUND OF THE INVENTION

Conventional n-type doped polysilicon gate electrodes in CMOS technology have two problems. Firstly, the polysilicon is conductive but there can still be a surface region which can be depleted of carriers under bias conditions. This appears as an extra gate insulator thickness and is commonly referred to as gate depletion and contributes to the equivalent oxide thickness. While this region is thin, in the order of a few angstroms (Å), it becomes appreciable as gate oxide thicknesses are reduced below 2 nm or 20 Å. Another problem is that the work function is not optimum for both n-MOS and p-MOS devices, historically this was compensated for by threshold voltage adjustment implantations. However, as the devices become smaller, with channel lengths of less than 1000 Å and consequently surface space charge regions of less than 100 Å, it becomes more and more difficult to do these implantations. Threshold voltage control becomes an important consideration as power supplies are reduced to the range of one volt. Optimum threshold voltages for both PMOS and NMOS transistors need to have a magnitude of around 0.3 Volts.

A solution to the polysilicon gate depletion problem is to replace the semiconducting gate material with a metal or highly conductive metallic nitrides. (See generally; Y. Yee-Chia et al., "Dual-metal gate CMOS technology with ultrathin silicon nitride gate dielectric IEEE Electron Device Letters, Volume: 22 Issue: 5, May, 2001, pp. 227229; L Qiang, Y. Yee Chia, et al., "Dual-metal gate technology for deep-submicron CMOS transistors," VLSI Technology, 2000; Digest of Technical Papers. 2000 Symposium on, 2000, pp. 72-73.; and H. Wakabayashi et al., "A dual-metal gate CMOS technology using nitrogen-concentration-controlled TiNx film," Electron Devices, IEEE Transactions on, Volume: 48 Issue: 10, Oct. 2001, Page(s): 2363-2369.).

As with any new circuit material, the gate electrode must be chemically and thermally compatible with both the transistor and the process. Different metals can be employed or the properties of the conductive nitride modified to provide an optimum work function. (See generally; above cited reference).

Figure 1A:
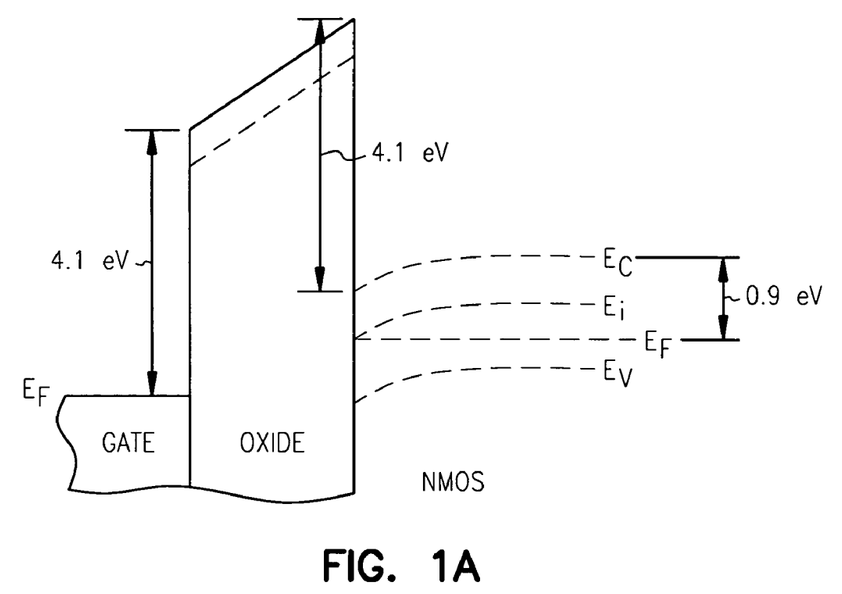
FIGS. 1A and 1B illustrate the desired energy band diagrams and work functions for NMOS and PMOS transistors respectively.
Figure 1B:
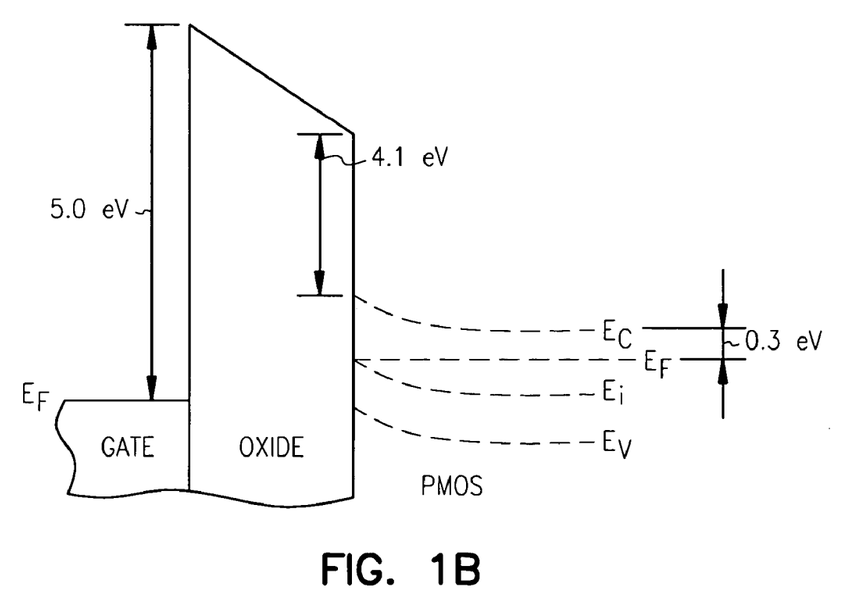

The work function of the gate electrode—the energy needed to extract an electron—must be compatible with the barrier height of the semiconductor material. For PMOS transistors, the required work function is about 5.0 eV. Achieving the lower work function needed by NMOS transistors, about 4.1 eV, has been more difficult. FIGS. 1A and 1B illustrate the desired energy band diagrams and work functions for NMOS and PMOS transistors respectively. Refractory metals like titanium (Ti) and tantalum (Ta) oxidize rapidly under typical process conditions. One proposed solution to the problem relies on a "tuned" ruthenium-tantalum (Ru—Ta) alloy, which is stable under process conditions. When the Ta concentration is below 20 percent, the alloy's electrical properties resemble Rhubidium (Ru), a good PMOS gate electrode. When the Ta concentration is between 40 percent and 54 percent, the alloy is a good NMOS gate electrode. (See generally; H. Zhong et al., "Properties of Ru—Ta Alloys as gate electrodes for NMOS and PMOS silicon devices," Digest of IEEE Int. Electron Devices Meeting, Washington D.C., 2001, paper 20.05; V. Misra, H. Zhong et al., "Electrical properties of Ru-based alloy gate electrodes for dual metal gate Si-CMOS," IEEE Electron Device Letters, Volume: 23 Issue: 6, Jun. 2002 Page(s): 354-356; and H. Zhong et al., "Electrical properties of RuO/sub 2/gate electrodes for dual metal gate Si-CMOS," IEEE Electron Device Letters, Volume: 21 Issue: 12, Dec. 2000 Page(s): 593-595).

Promising candidates include metallic nitrides, such as tantalum nitride (TaN) and titanium nitride (TiN). Tantalum nitride, titanium nitride, and tungsten nitride are mid-gap work function metallic conductors commonly described for use in CMOS devices. (See generally, H. Shimada et al., "Low resistivity bcc-Ta/TaN/sub x/metal gate MNSFETs having plane gate structure featuring fully low-temperature processing below 450 degrees C.," 2001 Symposium on VLSI Technology, 12-14 Jun. 2001, Kyoto, Japan Page: 67-68; H. Shimada et al., "Tantalum nitride metal gate FD-SOI CMOS FETs using low resistivity self-grown bcc-tantalum, layer," IEEE Trans. on Electron Devices, vol. 48, no. 8, pp. 1619-26, August 2001; B. Claflin et al., "Investigation of the growth and chemical stability of composite metal gates on ultra-thin gate dielectrics," MRS Symposium on Silicon Front-End Technology-Materials Processing and Modelling, 13-15 Apr., 1998, San Francisco, Calif., Page: 171-176; A. Yagishita et al., "Dynamic threshold voltage damascene metal gate MOSFET(DT-DMG-MOS) with low threshold voltage, high drive current and uniform electrical characteristics," Digest Technical Papers Int. Electron Devices Meeting, San Francisco, December 2000, pp. 663-6; B. Claflin et al., "Investigation of the growth and chemical stability of composite metal gates on ultra-thin gate dielectrics," MRS Symposium on Silicon Front-End Technology-Materials Processing and Modelling, 13-15 Apr., 1998, San Francisco, Calif., Page: 171-176; and M. Moriwaki et al., "Improved metal gate process by simultaneous gate-oxide nitridation during W/WN/sub x/gate formation," Jpn. J. Appl. Phys., vol. 39. No. 4B, pp. 2177-80, 2000). The use of a mid-gap work finction makes the threshold voltages of NMOS and PMOS devices symmetrical in that the magnitudes of the threshold voltages will be the same, but both will have a magnitude larger than that which is optimum with low power supply voltages.

Recently physical deposition, evaporation, has been used to investigate the suitability of some ternary metallic nitrides for use as gate electrodes, these included TiAlN and TaSiN. (See generally, Dae-Gyu Park et al., "Robust ternary metal gate electrodes for dual gate CMOS devices," Electron Devices Meeting, 2001. IEDM Technical Digest. International, 2001 Page(s): 30.6.1-30.6.4). However, these were deposited by physical deposition not atomic layer deposition and only capacitor structures were fabricated, not transistors with gate structures.

Thus, there is an ongoing need for improved CMOS transistor design.

SUMMARY OF THE INVENTION

The above mentioned problems CMOS transistor design as well as other problems are addressed by the present invention and will be understood by reading and studying the following specification. This disclosure describes the use of atomic layer deposition of ternary metallic conductors where the composition and work function are varied to control the threshold voltage of both the NMOS and PMOS transistors in CMOS technology to provide optimum performance.

In particular, an embodiment of the present invention includes a transistor having a source region a drain region and a channel therebetween. A gate is separated from the channel region by a gate insulator. The gate includes a ternary metallic conductor formed by atomic layer deposition. In one embodiment the ternary metallic conductor includes Tantalum Aluminum Nitride (TaAlN). In one embodiment the ternary metallic conductor includes Titanium Aluminum Nitride (TiAlN). In one embodiment the ternary metallic conductor includes Titanium Silicon Nitride (TiSiN). In one embodiment the ternary metallic conductor includes Tungsten Aluminum Nitride (WAlN). In some embodiments the gate further includes a refractory metal formed on the ternary metallic conductor.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

DETAILED DESCRIPTION

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator is defined to include any material that is less electrically conductive than the materials referred to as conductors. The following detailed description is, therefore, not to be taken in a limiting sense, and the scope of the present invention is defined only by the appended claims, along with the full scope of equivalents to which such claims are entitled.

Figure 2:
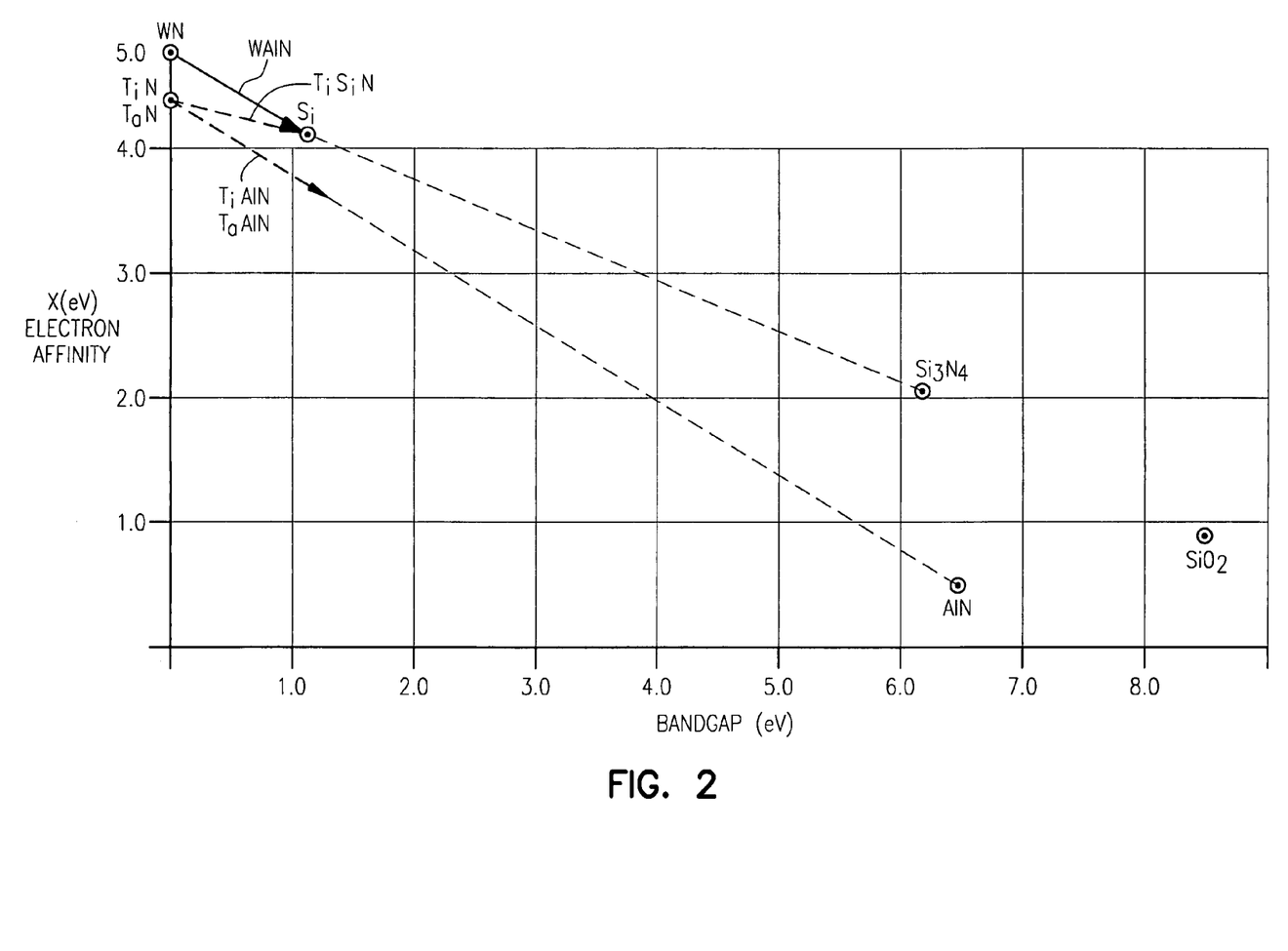
FIG. 2 is a graph which plots electron affinity versus the energy bandgap for various metallic nitrides employed in various embodiments of the present invention.
Figure 3:
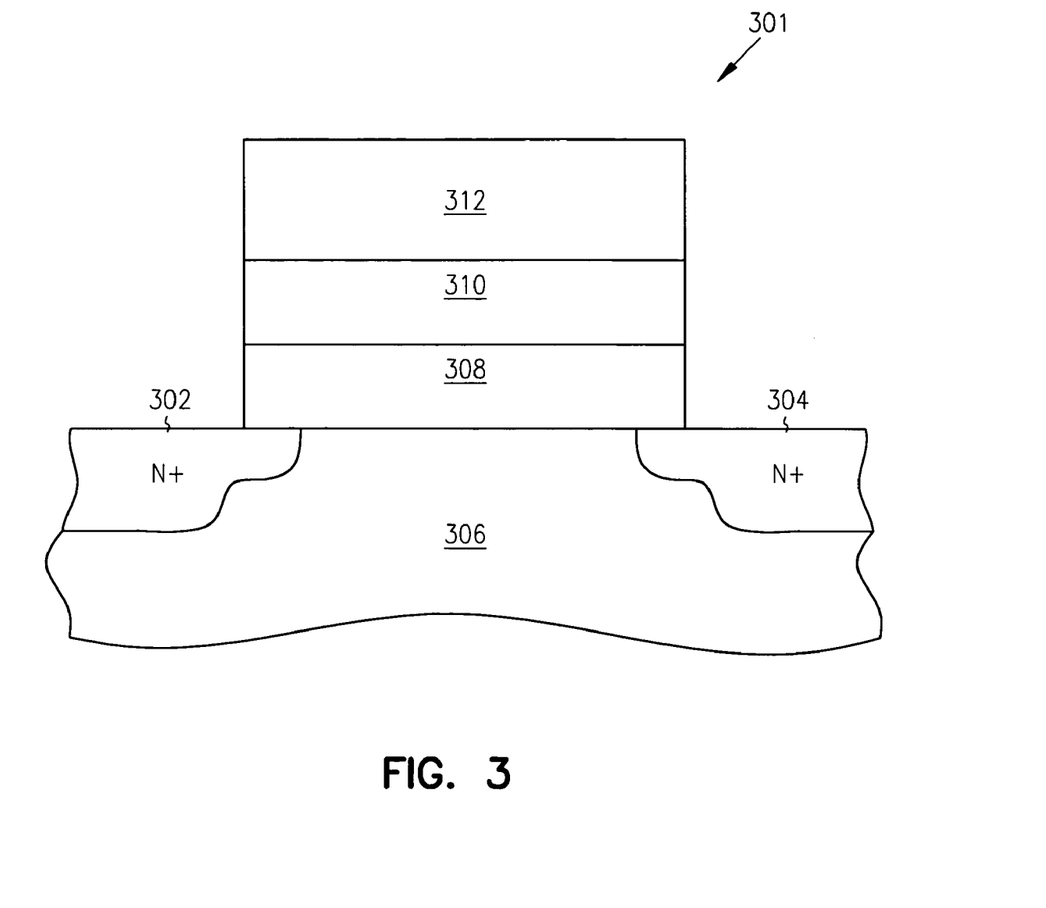
FIG. 3 illustrates an embodiment of a transistor structure formed according to the teachings of the present invention.

This disclosure describes the use of atomic layer deposition of ternary metallic conductors where the composition is varied and work function varied, see FIG. 2, to control the threshold voltage of both the NMOS and PMOS transistors in CMOS technology to provide optimum performance. In the several embodiments, these include the use of TaAlN, TiAlN, TiSiN, and WAlN as the ternary metallic conductors. Conventional highly doped polysilicon or refractory metals as W, Ta, Ti are deposited over the metallic conductors to give the gate structure shown in FIG. 3. As shown in FIG. 3, the transistor 301 structure includes a source region 302, a drain region 304, and a channel 306 therebetween. A gate 310 is separated from the channel region by a gate insulator 308. According to the teachings of the present invention, the gate 310 includes a ternary metallic conductor formed by atomic layer deposition. In one embodiment the ternary metallic conductor includes Tantalum Aluminum Nitride (TaAlN). In one embodiment the ternary metallic conductor includes Titanium Aluminum Nitride (TiAlN). In one embodiment the ternary metallic conductor includes Titanium Silicon Nitride (TiSiN). In one embodiment the ternary metallic conductor includes Tungsten Aluminum Nitride (WAlN). As shown in FIG. 3, in some embodiments the gate further includes a layer of highly conductive polysilicon 312, or alternatively a refractory metal layer 312, formed on the ternary metallic conductor 310. In embodiments having a refractory metal layer, the layer 312 includes for example, and not by way of limitation, refractory metals such as tantalum, titanium and tungsten.

Methods of Formation

Atomic Layer Deposition developed in the early 70s is a modification of CVD and can also be called as "alternately pulsed-CVD". (See generally, Ofer Sneh et al., "Thin film atomic layer deposition equipment for semiconductor processing", Thin Solid Films, 402 (2002) 248-261). In this technique, gaseous precursors are introduced one at a time to the substrate surface, and between the pulses the reactor is purged with an inert gas or evacuated. In the first reaction step the precursor is saturatively chemisorbed at the substrate surface, and during the subsequent purging the precursor is removed from the reactor. In the second step, other precursor is introduced on the substrate and the desired films growth reaction takes place. After that the reaction byproducts and the precursor excess are purged out from the reactor. When the precursor chemistry is favorable, i.e. the precursor adsorb and react with each other aggressively, one ALD cycle can be preformed in less than one second in the properly designed flow type reactors.

The striking feature of ALD is the saturation of all the reaction and purging steps which makes the growth self-limiting. This brings the large area uniformity and conformality, the most important properties of ALD, as shown in very different cases, viz. planar substrates, deep trenches, and in the extreme cases of porous silicon and high surface area silica and alumina powers. Also the control of the film thickness is straightforward and can be made by simply calculating the growth cycles. ALD was originally developed to manufacture luminescent and dielectric films needed in electroluminescent displays, and a lot of effort has been put to the growth of doped zinc sulfide and alkaline earth metal sulfide films. Later ALD has been studied for the growth of different epitaxial II-V and II-VI films, nonepitaxial crystalline or amorphous oxide and nitride films are their multilayer structures.

There has been considerable interest towards the ALD growth of silicon and germanium films but due to the difficult precursor chemistry the results have not been very successful.

Reaction sequence ALD (RS-ALD) films have several unique and unmatched advantages:

- Continuity at the interface avoiding poorly defined nucleating regions that are typical for CVD (<20 Å) and PVD (<50 Å) films. To achieve this continuity, the substrate surface must be activated to react directly with the first exposure of RS-ALD precursor.
- Unmatched conformality over toughest substrate topologies with robust processes that can only be achieved with a layer-by-layer deposition technique.
- Typically, low temperature and mildly oxidizing processes. This is thought to be a major advantage for gate insulator processing where deposition of non-silicon based dielectrics without oxidizing the substrate (with the oxidation-precursor) is a major concern.
- RS-ALD ability to engineer multilayer laminate films, possibly down to monolayer resolution, as well as alloy composite films appear to be unique. This ability comes from the combination of being able to control deposition with monolayer precision and the ability to deposit continuous monolayers of amorphous films (that is unique to RS-ALD).
- Unprecedented process robustness. RS-ALD processes are free of first wafer effects and the chamber dependence. Accordingly, RS-ALD processes will be easier to transfer from development to production and from 200 to 300 mm wafer size.
- Thickness depends solely on the number of cycles. Thickness can be "dialed in" as a simple recipe change bearing no need for additional process development upon technology generation advance.

(See generally, Shunsuke Morishita et al., "Atomic-Layer Chemical-Vapor-Deposition of $SiO_2$ by Cyclic Exposure of $CHOSi(NCO)_3$ and $H_2O_2$," Jpn. J. Appl. Phys. Vol. 34 (1955) pp. 5738-5742.).

Atomic Layer Deposition of Nitrides

Ta—N: Plasma-enhanced atomic layer deposition (PEALD) of tantalum nitride (Ta—N) thin films at a deposition temperature of 260° C. using hydrogen radicals as a reducing agent for Tertbutylimidotris(diethylamido) tantalum have been described. (See generally, Jin-Seong Park et al, "Plasma-Enhanced Atomic Layer Deposition of Tantalum Nitrides Using Hydrogen Radicals as a Reducing Agent", Electrochemical and Solid-State Lett., 4(4) C17-C19, 2001). The PEALD yields superior Ta—N films with an electric resistivity of 400 µΩcm and no aging effect under exposure to air. The film density is higher than that of Ta—N films formed by typical ALD, in which $NH_3$ is used instead of hydrogen radicals. In addition, the as-deposited films are not amorphous, but rather polycrystalline structure of cubit TaN. The density and crystallinity of the films increases with the pulse time of hydrogen plasma. The films are Ta-rich in composition and contain around 15 atomic % of carbon impurity. In the PEALD of Ta—N films, hydrogen radicals are used a reducing agent instead of $NH_3$, which is used as a reactant gas in typical Ta—N ALD. Films are deposited on $SiO_2$ (100 nm)/Si wafers at a deposition temperature of 260° C. and a deposition pressure of 133 Pa in a cold-walled reactor using $(Net_2)_3$ Ta=Nbu' [tertbutylimidotris(diethylamido)tantalum, TBTDET] as a precursor of Ta. The liquid precursor is contained in a bubbler heated at 70° C. and carried by 35 sccm argon. One deposition cycle consist of an exposure to a metallorganic precursor of TBTDET, a purge period with Ar, and an exposure to hydrogen plasma, followed by another purge period with Ar. The Ar purge period of 15 seconds instead between each reactant gas pulse isolates the reactant gases from each other. To ignite and maintain the hydrogen plasma synchronized with the deposition cycle, a rectangular shaped electrical power is applied between the upper and lower electrode. The showerhead for uniform distribution of the reactant gases in the reactor, capacitively coupled with an rf (13.56 MHz) plasma source operated at a power of 100 W, is used as the upper electrode. The lower electrode, on which a wafer resides, is grounded. Film thickness and morphology were analyzed by field emission scanning electron microscopy.

Ta(Al)N(C): Technical work on thin films have been studied using $TaCl_5$ or $TaBr_5$ and $NH_3$ as precursors and $Al(CH_3)_3$ as an additional reducing agent. (See generally, Petra Alen et al., "Atomic Layer Deposition of Ta(Al)N(C) Thin Films Using Trimethylaluminum as a Reducing Agent", Jour. of the Electrochemical Society, 148 (10), G566-G571 (2001)). The deposition temperature is varied between 250 and 400° C. The films contained aluminum, carbon, and chlorine impurities. The chlorine content decreased drastically as the deposition temperature is increased. The film deposited at 400° C. contained less than 4 atomic % chlorine and also had the lowest resistivity, 1300 µΩcm. Five different deposition processes with the pulsing orders $TaCl_5$-TMA-$NH_3$, TMA-$TaCl_5$—$NH_3$, $TaBr_5$—$NH_3$, $TaBr_5$—Zn—$NH_3$, and $TaBr_5$-TMA-$NH_3$ are used. $TaCl_5$, $TaBr_5$, and Zn are evaporated from open boats held inside the reactor. The evaporation temperatures for $TaCl_4$, $TaBr_5$, and Zn are 90, 140, 380° C., respectively. Ammonia is introduced into the reactor through a mass flowmeter, a needle valve, and a solenoid valve. The flow rate is adjusted to 14 sccm during a continuous flow. TMA is kept at a constant temperature of 16° C. and pulsed through the needle and solenoid valve. Pulse times are 0.5 s for $TaCl_5$, $TaBr_5$, $NH_3$, and Zn whereas the pulse length of TMA is varied between 0.2 and 0.8 s. The length of the purge pulse is always 0.3 s. Nitrogen gas is used for the transportation of the precursor and as a purging gas. The flow rate of nitrogen is 400 sccm.

TiN: Atomic layer deposition (ALD) of amorphous TiN films on $SiO_2$ between 170° C. and 210° C. has been achieved by the alternate supply of reactant sources, $Ti[N(C_2H_5CH_3)_2]_4$ [tetrakis(ethylmethylamino)titanium: TEMAT] and $NH_3$. These reactant sources are injected into the reactor in the following order: TEMAT vapor pulse, Ar gas pulse, NH$_3$ gas pulse and Ar gas pulse. Film thickness per cycle saturated at around 1.6 monolayers per cycle with sufficient pulse times of reactant sources at 200° C. The results suggest that film thickness per cycle could exceed 1 ML/cycle in ALD, and are explained by the rechemisorption mechanism of the reactant sources. An ideal linear relationship between number of cycles and film thickness is confirmed. (See generally, J. -S. Min et al., "Atomic layer deposition of TiN films by alternate supply on Tetrakis (ethylmethyllamino)-titanium and ammonia," *Jpn. J. Appl. Phys.*, Vol. 37, Part 1, No. 9A, pp. 4999-5004, 15 Sep. 1998).

TiAlN: Koo et al published paper on the study of the characteristics of TiAlN thin film deposited by atomic layer deposition method. (See generally, Jaehyong Koo et al., "Study on the characteristics of TiAlN thin film deposited by atomic layer deposition method," *J. Vac. Sci. Technol. A*, 19(6), 2831-2834 (2001)). The series of metal-Si—N barriers have high resistivity above 1000 μΩcm. They proposed another ternary diffusion barrier of TiAlN. TiAlN film exhibited a NaCl structure in spite of considerable Al contents. TiAlN films are deposited using the TiCl$_4$ and dimethylaluminum hydride ethypiperdine (DMAH-EPP) as the titanium and aluminum precursors, respectively. TiCl$_4$ is vaporized from the liquid at 13-15° C. and introduced into the ALD chamber, which is supplied by a bubbler using the Ar carrier gas with a flow rate of 30 sccm. The DMAH-EPP precursor is evaporated at 60° C. and introduced into the ALD chamber with the same flow rate of TiCl$_4$. The NH$_3$ gas is also used as a reactant gas and its flow rate is about 60 sccm. Ar purging gas is introduced for the complete separation of the source and reactant gases. TiAlN films are deposited at the temperatures between 350 and 400° C. and total pressure is kept constant to be two torr.

TiSiN: Metal-organic atomic-layer deposition (MOALD) achieves near-perfect step coverage step and control precisely the thickness and composition of grown thin films. A MOALD technique for ternary Ti—Si—N films using a sequential supply of Ti[N(CH$_3$)$_2$]$_4$ [tetrakis (dimethylamido) titanium: TDMAT], silane (SiH$_4$), and ammonia (NH$_3$), has been developed and evaluated the Cu diffuision barrier characteristics of a 10 mn Ti—Si—N film with high-frequency C-V measurements. (See generally, Jae-Sik Min et al, "Metal-organic atomic-layer deposition of titanium-silicon-nitride films", *Appl. Phys, Lett.*, Vol. 75, No. 11, 1521-1523 (1999)). At 180° C. deposition temperature, silane is supplied separately in the sequence of the TDMAT pulse, silane pulse, and the ammonia pulse. The silicon content is the deposited films and the deposition thickness per cycle remained almost constant at 18 at. % and 0.22 nm/cycle, even though the silane partial pressure varied from 0.27 to 13.3 Pa. Especially, the Si content dependence is strikingly different from the conventional chemical-vapor deposition. Step coverage is approximately 100% even on the 0.3 μm diameter hole with slightly negative slope and 10:1 aspect ratio.

WN: Tungsten nitride films have been deposited with the atomic layer control using sequential surface reactions. The tungsten nitride film growth is accomplished by separating the binary reaction 2WF$_6$+NH$_3$->W$_2$N+3HF+9/2F$_2$ into two half-reactions. (See generally, J. W. Kraus et al, "Atomic Layer Deposition of Tungsten Nitride Films Using Sequential Surface Reactions", 147 (3) 1175-1181 (2000)). Successive application of the WF$_6$ and NH$_3$ half-reactions in an ABAB . . . sequence produced tungsten nitride deposition at substrate temperatures between 600 and 800 K. Transmission Fourier transform infrared (FTIR) spectroscopy monitored the coverage of WF$_x$* and NH$_y$* surface species on high surface area particles during the WF$_6$ and NH$_3$ half-reactions. The FTIR spectroscope results demonstrated the WF$_6$ and NH$_3$ half-reactions are complete and self-limiting at temperatures>600 K. In situ spectroscopic ellipsometry monitored the film growth on Si(100) substrate vs. temperature and reactant exposure. A tungsten nitride deposition rate of 2.55 Å/AB cycle is measured at 600-800 K for WF$_6$ and NH$_3$ reactant exposure>3000 L and 10,000 L, respectively. X-ray photoelectron spectroscopy depth-profiling experiments determined that the films had a W$_2$N stoichiometry with low C and O impurity concentrations. X-ray diffraction investigations revealed that the tungsten nitride films are microcrystalline. Atomic force microscopy measurements of the deposited films observed remarkably flat surface indicating smooth film growth. These smooth tungsten nitride films deposited with atomic layer control should be used as diffusion control for Cu on contact and via holes.

AlN: Aluminum nitride (AlN) has been grown on porous silica by atomic layer chemical vapor deposition (ALCVD) from trimethylaluminum (TMA) and ammonia precursors. (See generally, R. L. Pruurunen et al, "Growth of aluminum nitride on porous silica by atomic layer chemical vapor deposition", *Applied Surface Science*, 165, 193-202 (2000)). The ALCVD growth is based on alternating, separated, saturating reactions of the gaseous precursors with the solid substrates. TMA and ammonia are reacted at 423 and 623 Kelvin (K), respectively, on silica which has been dehydroxylated at 1023 K pretreated with ammonia at 823 K. The growth in three reaction cycles is investigated quantitatively by elemental analysis, and the surface reaction products are identified by IR and solid state and Si NMR measurements. Steady growth of about 2 aluminum atoms/nm$^2$ silica/reaction cycle is obtained. The growth mainly took place through (I) the reaction of TMA which resulted in surface Al—Me and Si—Me groups, and (II) the reaction of ammonia which replaced aluminium-bonded methyl groups with amino groups. Ammonia also reacted in part with the silicon-bonded methyl groups formed in the dissociated reaction of TMA with siloxane bridges. TMA reacted with the amino groups, as it did with surface silanol groups and siloxane bridges. In general, the Al—N layer interacted strongly with the silica substrates, but in the third reaction cycle AlN-type sites may have formed.

Devices

Figure 4:
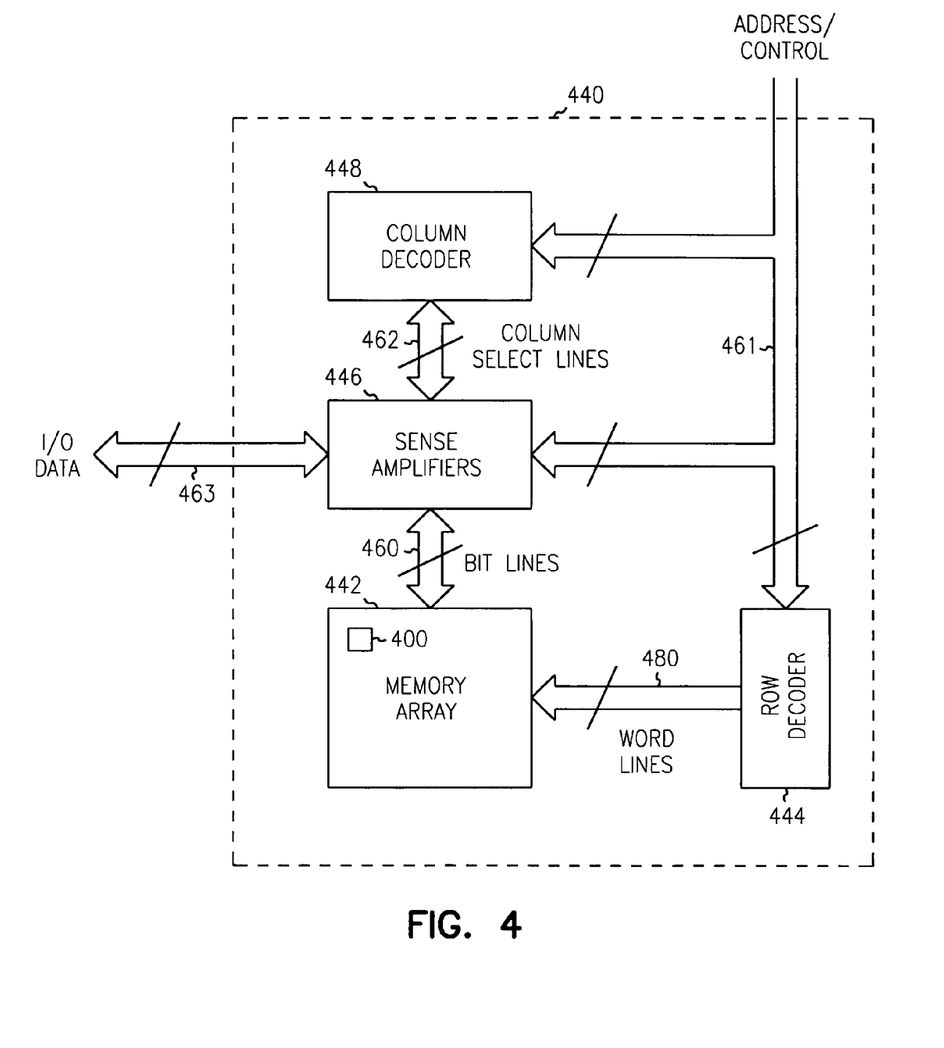
FIG. 4 illustrates an embodiment of a memory device, utilizing ternary metallic gates formed by atomic layer deposition, according to embodiments of the present invention.

In FIG. 4 a memory device is illustrated according to the teachings of the present invention. The memory device 440 contains a memory array 442, row and column decoders 444, 448 and a sense amplifier circuit 446. The memory array 442 consists of a number of transistor cells 400, having ternary metallic gates formed by atomic layer deposition, whose word lines 480 and bit lines 460 are commonly arranged into rows and columns, respectively. The bit lines 460 of the memory array 442 are connected to the sense amplifier circuit 446, while its word lines 480 are connected to the row decoder 444. Address and control signals are input on address/control lines 461 into the memory device 440 and connected to the column decoder 448, sense amplifier circuit 446 and row decoder 444 and are used to gain read and write access, among other things, to the memory array 442.

The column decoder 448 is connected to the sense amplifier circuit 446 via control and column select signals on column select lines 462. The sense amplifier circuit 446 receives input data destined for the memory array 442 and outputs data read from the memory array 442 over input/ output (I/O) data lines 463. Data is read from the cells of the memory array 442 by activating a word line 480 (via the row decoder 444), which couples all of the memory cells corresponding to that word line to respective bit lines 460, which define the columns of the array. One or more bit lines 460 are also activated. When a particular word line 480 and bit lines 460 are activated, the sense amplifier circuit 446 connected to a bit line column detects and amplifies the conduction sensed through a given transistor cell and transferred to its bit line 460 by measuring the potential difference between the activated bit line 460 and a reference line which may be an inactive bit line. Again, in the read operation the source region of a given cell is couple to a grounded sourceline or array plate (not shown). The operation of Memory device sense amplifiers is described, for example, in U.S. Pat. Nos. 5,627,785; 5,280,205; and 5,042,011, all assigned to Micron Technology Inc., and incorporated by reference herein.

Figure 5:
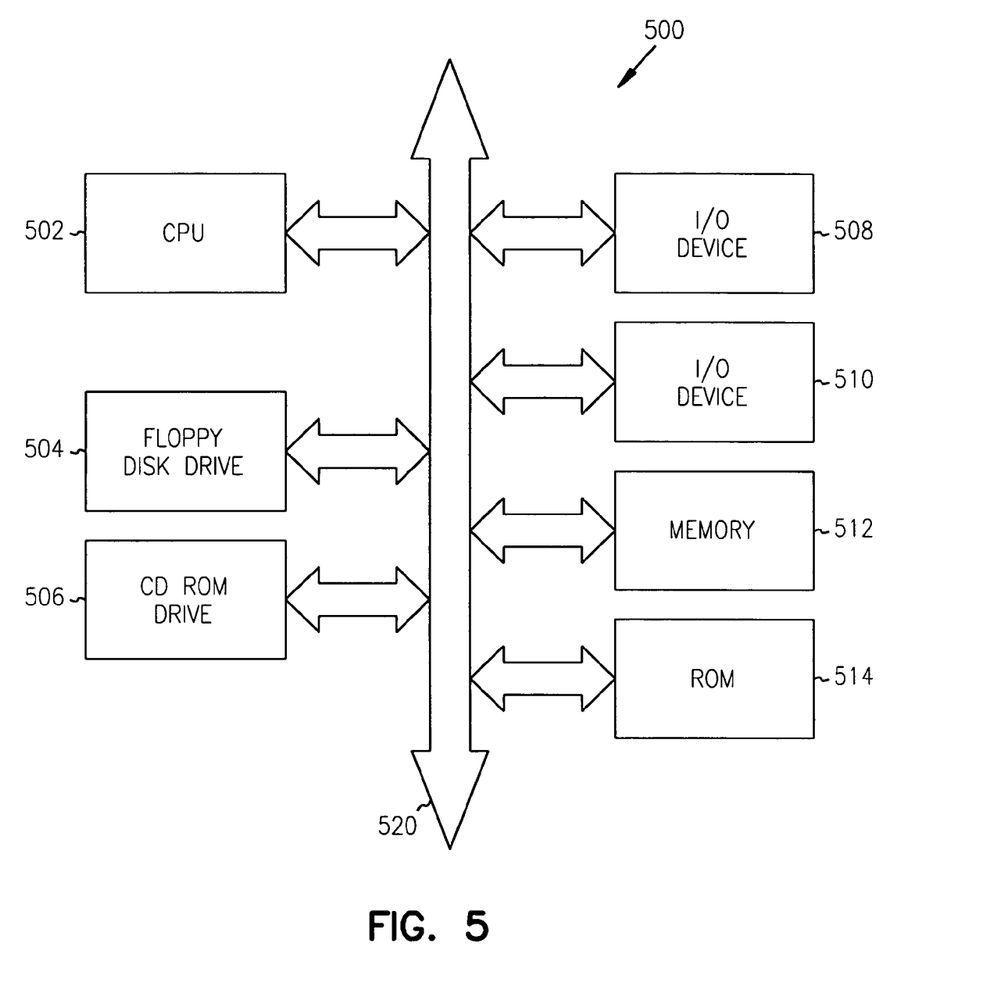
FIG. 5 is a block diagram of an electrical system, or processor-based system, utilizing ternary metallic gates formed by atomic layer deposition, according to embodiments of the present invention.

FIG. 5 is a block diagram of an electrical system, or processor-based system, 500 utilizing transistor cells having ternary metallic gates formed by atomic layer deposition according to the teachings of the present invention. For example, by way of example and not by way of limitation, memory 512 is constructed in accordance with the present invention to have transistor cells having ternary metallic gates formed by atomic layer deposition. However, the invention is not so limited and the same can apply to transistors in the CPU, etc. The processor-based system 500 may be a computer system, a process control system or any other system employing a processor and associated memory. The system 500 includes a central processing unit (CPU) 502, e.g., a microprocessor, that communicates with the memory 512 and an I/O device 508 over a bus 520. It must be noted that the bus 520 may be a series of buses and bridges commonly used in a processor-based system, but for convenience purposes only, the bus 520 has been illustrated as a single bus. A second I/O device 510 is illustrated, but is not necessary to practice the invention. The processor-based system 500 can also includes read-only memory (ROM) 514 and may include peripheral devices such as a floppy disk drive 504 and a compact disk (CD) ROM drive 506 that also communicates with the CPU 502 over the bus 520 as is well known in the art.

It will be appreciated by those skilled in the art that additional circuitry and control signals can be provided, and that the processor-based system 500 has been simplified to help focus on the invention.

It will be understood that the embodiment shown in FIG. 5 illustrates an embodiment for electronic system circuitry in which the novel ternary metallic gate transistor cells, formed by atomic layer deposition, are used. The illustration of system 500, as shown in FIG. 5, is intended to provide a general understanding of one application for the structure and circuitry of the present invention, and is not intended to serve as a complete description of all the elements and features of an electronic system using the novel ternary metallic gate transistor cells, formed by atomic layer deposition. Further, the invention is equally applicable to any size and type of system 500 using the novel ternary metallic gate transistor cells, formed by atomic layer deposition, and is not intended to be limited to that described above. As one of ordinary skill in the art will understand, such an electronic system can be fabricated in single-package processing units, or even on a single semiconductor chip, in order to reduce the communication time between the processor and the memory device.

Applications containing the novel ternary metallic gate transistor cells, formed by atomic layer deposition as described in this disclosure, include electronic systems for use in memory modules, device drivers, power modules, communication modems, processor modules, and application-specific modules, and may include multilayer, multi-chip modules. Such circuitry can further be a subcomponent of a variety of electronic systems, such as a clock, a television, a cell phone, a personal computer, an automobile, an industrial control system, an aircraft, and others.

CONCLUSION

This disclosure describes the use of atomic layer deposition of ternary metallic conductors as transistor gates. The composition is varied and work function varied to control the threshold voltage of both the NMOS and PMOS transistors in CMOS technology to provide optimum performance.

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A method for forming a transistor pair, comprising:
   forming a PMOS transistor;
   forming an NMOS transistor; and
   wherein forming the NMOS and the PMOS transistors includes forming a varied gate composition having a varied work function on each respective transistor in order to control a threshold voltage for each respective transistor to a same magnitude;
   wherein forming a varied gate composition includes:
   forming a gate with a binary metallic conductor for one of the NMOS and PMOS transistors; and
   forming a gate with a ternary metallic conductor for the other one of the NMOS and PMOS transistors.

2. The method of claim 1, wherein forming a binary metallic conductor includes forming tantalum nitride (TaN).

3. The method of claim 1, wherein forming a binary metallic conductor includes forming titanium nitride (TiN).

4. The method of claim 1, wherein forming a binary metallic conductor includes forming tungsten nitride (WN).

5. The method of claim 1, wherein forming a ternary metallic conductor includes forming Tantalum Aluminum Nitride (TaAlN).

6. The method of claim 1, wherein forming a ternary metallic conductor includes forming Titanium Aluminum Nitride (TiAlN).

7. The method of claim 1, wherein forming a ternary metallic conductor includes forming Titanium Silicon Nitride (TiSiN).

8. The method of claim 1, wherein forming a ternary metallic conductor includes forming Tungsten Aluminum Nitride (WAlN).

9. The method of claim 1, further includes forming a refractory metal on the ternary metallic conductor.

10. A method for forming a transistor pair, comprising:
    forming a PMOS transistor;
    forming an NMOS transistor; and wherein forming the NMOS and the PMOS transistors includes forming a varied gate composition having a varied work function on each respective transistor in order to control a threshold voltage for each respective transistor to a same magnitude, wherein forming a varied gate composition includes forming a ternary metallic conductor using atomic layer deposition, and depositing a refractory metal on the gate.

11. The method of claim 10, wherein:

forming a ternary metallic conductor includes forming Tungsten Aluminum Nitride (WAlN); and depositing a refractory metal includes depositing Tungsten (W).

12. The method of claim 10, wherein:

forming a ternary metallic conductor includes forming Tantalum Aluminum Nitride (TaAlN); and depositing a refractory metal includes depositing Tantalum (Ta).

13. The method of claim 10, wherein:

forming a ternary metallic conductor includes forming Titanium Aluminum Nitride (TiAlN); and depositing a refractory metal includes depositing Titanium (Ti).

14. The method of claim 10, wherein:

forming a ternary metallic conductor includes forming Titanium Silicon Nitride (TiSiN); and depositing a refractory metal includes depositing Titanium (Ti).

* * * * *